United States Patent
Takase

(10) Patent No.: US 8,456,256 B2
(45) Date of Patent: Jun. 4, 2013

(54) ELECTRONIC COMPONENT AND PASSIVE COMPONENT

(75) Inventor: Kouhei Takase, Saku (JP)

(73) Assignee: Soshin Electric Co., Ltd., Saku (JP)

( * ) Notice: Subject to any disclaimer, the term of this patent is extended or adjusted under 35 U.S.C. 154(b) by 539 days.

(21) Appl. No.: 12/681,796

(22) PCT Filed: Oct. 30, 2008

(86) PCT No.: PCT/JP2008/069786
§ 371 (c)(1),
(2), (4) Date: Apr. 6, 2010

(87) PCT Pub. No.: WO2009/057706
PCT Pub. Date: May 7, 2009

(65) Prior Publication Data
US 2010/0231328 A1    Sep. 16, 2010

(30) Foreign Application Priority Data
Oct. 31, 2007    (JP) .................................. 2007-284246

(51) Int. Cl.
*H03H 7/01*    (2006.01)
*H01F 27/28*    (2006.01)

(52) U.S. Cl.
USPC .......................................... 333/185; 336/200

(58) Field of Classification Search
CPC ........... H03H 7/0115; H03H 2001/0085; H01F 17/0013
USPC ..................... 333/185, 204, 25, 26; 336/200, 336/232, 199
See application file for complete search history.

(56) References Cited

U.S. PATENT DOCUMENTS

| 6,115,264 A | 9/2000 | Nosaka |
| 6,411,178 B1* | 6/2002 | Matsumura et al. ........... 333/134 |
| 7,167,070 B2 | 1/2007 | Tanaka et al. |
| 2008/0186106 A1* | 8/2008 | Christian et al. .............. 333/133 |

FOREIGN PATENT DOCUMENTS

| JP | 06-140250 A1 | 5/1994 |
| JP | 08-186024 A1 | 7/1996 |
| JP | 11-097244 A1 | 4/1999 |
| JP | 11-097963 A1 | 4/1999 |
| JP | 11-186038 A1 | 7/1999 |
| JP | 11-261362 A1 | 9/1999 |
| JP | 2006-041820 A1 | 2/2006 |
| WO | 2005/024863 A1 | 3/2005 |

OTHER PUBLICATIONS

Japanese Office Action dated Nov. 6, 2012 (with partial English translation).

* cited by examiner

*Primary Examiner* — Ryan Johnson
(74) *Attorney, Agent, or Firm* — Burr & Brown

(57) ABSTRACT

An electronic component and a passive component define correlation between a distance between a pair of identical patterns and a distance between pairs of identical patterns adjacent to each other in a laminating direction, and a value of an inductor is further improved, attenuation in adjacent frequency bands is ensured and low power consumption is achieved with low loss. A first inductor is composed of a pair of inductor forming electrodes, a pair of inductor forming electrodes and a pair of inductor forming electrodes. A relationship between a distance (Da) between the two electrodes configuring each pair of inductor forming electrodes and a distance (Db) between the pairs of inductor forming electrodes adjacent to each other in the laminating direction satisfy the following inequalities; $0 < Da \leq Db$ and $0 < Da \leq 20\,\mu m$.

1 Claim, 18 Drawing Sheets ically identical shapes disposed in a dielectric substrate, and which are laminated with dielectric layers sandwiched therebetween, the conductive patterns being electrically connected to each other to result in a single signal line. The resistive component of the signal line, which functions as an inductor, thus is reduced for improving the Q factor of the inductor.

ELECTRONIC COMPONENT AND PASSIVE COMPONENT

BACKGROUND Of THE INVENTION

1. Field of Invention

The present invention relates to an electronic component having inductors disposed in a dielectric substrate, which is made up of a plurality of laminated dielectric layers, and to a passive component utilizing such an electronic component. More particularly, the present invention concerns an electronic component and a passive component, which are suitable for use in a filter such as a low-pass filter, a bandpass filter, a high-pass filter, or the like, and a triplexer incorporating such a filter or the like.

2. Description of Related Art

Heretofore, electronic components have been known having inductors disposed in a dielectric substrate, which is made up of a plurality of laminated dielectric layers. Patent Documents 1 through 4, for example, have been proposed particularly for improving the Q factor of such inductors.

The electronic component disclosed in Patent Document 1 has three conductive patterns having substantially identical shapes disposed in a dielectric substrate, and which are laminated with dielectric layers sandwiched therebetween, the conductive patterns being electrically connected to each other to result in a single signal line. The resistive component of the signal line, which functions as an inductor, thus is reduced for improving the Q factor of the inductor.

Patent Document 2 discloses an example in which coil electrodes are disposed respectively on a plurality of certain dielectric layers in order to form a coil, the axis of which is substantially perpendicular to a direction in which the dielectric layers are stacked. In particular, Patent Document 2 discloses an example in which coil electrodes having identical patterns are disposed on a plurality of dielectric layers. According to the laminated coil component disclosed in Patent Document 2, it is possible to prevent spaced intervals between adjacent via holes, which are arrayed along the axis of the coil, from becoming reduced, while at the same time increasing the volume of each of the via holes.

Patent Document 3 discloses a coil formed by stacking two spiral coil patterns having essentially identical shapes, which are disposed in a dielectric substrate with a dielectric layer sandwiched therebetween, and electrically connecting the coil patterns. Such an in-substrate layer coil, as disclosed in Patent Document 3, is small in size and has a high Q factor.

Patent Document 4 discloses a first coil formed by stacking two first coil patterns having essentially identical shapes, which are disposed in a dielectric substrate with a dielectric layer sandwiched therebetween, and electrically connecting the first coil patterns. Patent Document 4 also discloses a second coil formed by stacking two second coil patterns having essentially identical shapes below the first coil with a dielectric layer sandwiched therebetween, and electrically connecting the second coil patterns. The laminated inductor disclosed in Patent Document 4 makes it possible to minimize conductor loss without causing insulating layers to peel off, and also without increasing the planar area of the substrate.

Patent Document 1: Japanese Laid-Open Patent Publication No. 11-186038

Patent Document 2: International Publication No. 2005/024863

Patent Document 3: Japanese Laid-Open Patent Publication No. 06-140250

Patent Document 4: Japanese Laid-Open Patent Publication No. 08-186024

SUMMARY OF THE INVENTION

As can be seen from the above-described Patent Documents 1 through 4, it is known to provide a pair of identical patterns in an inductor structure, which is either vertically coiled (see Patent Document 2) or laterally coiled (see Patent Documents 1, 3 and 4).

However, there is nothing disclosed concerning a change in the inductance value due to a correlation of the distance between a pair of identical patterns and the distance between pairs of identical patterns that are adjacent to each other along the direction in which they are stacked, or about a further increase in the Q factor of the inductor. Only a structure having a pair of identical patterns will cause a reduction in the inductance value and a degradation of the Q factor of the inductor, unlike an inductor comprising a single pattern. Controlling a reduction in the inductance value requires an increase in the number of turns of the inductor patterns and/or an increase in the turn diameter, thus causing a problem in that the inductor becomes larger in size.

Communication terminal devices in recent years have adjacent frequency bands used by applications (GPS, television, wireless communications, etc.) run thereby, resulting in an interference problem.

Consequently, filters are required to achieve attenuation in adjacent frequency bands, as well as a low power consumption level based on low loss. Naturally, filters also are required to be small in size. The disclosures of Patent Documents 1 through 4 described above are not sufficient to meet these requirements, and further study is needed.

The present invention has been made in view of the aforementioned difficulties. It is an object of the present invention to provide an electronic component and a passive component, which enable an inductor to be small in size, and at the same time to further increase the Q factor of the inductor, thereby achieving attenuation in adjacent frequency bands, and realizing a low power consumption level based on low loss, by clarifying the correlation of the distance between a pair of identical patterns and the distance between pairs of identical patterns that are adjacent to each other along a direction in which they are stacked.

An electronic component according to a first invention comprises a dielectric substrate including a plurality of stacked dielectric layers, and at least two pairs of inductor-forming electrodes disposed in the dielectric substrate with dielectric layers interposed therebetween, the inductor-forming electrodes being electrically connected to each other through via holes. The at least two pairs of inductor-forming electrodes are arrayed along a direction in which the dielectric layers are stacked, each of the two pairs of inductor-forming electrodes being electrically connected to each other through via holes disposed therebetween, thereby making up a single inductor, wherein the relation $0 < Da \leq Db$ is satisfied, where Da represents the shortest distance between each of the pairs of inductor-forming electrodes, and Db represents the shortest distance between pairs of inductor-forming electrodes that are adjacent to each other.

The value Da preferably falls within the range:

$$0 \text{ μm} < Da \leq 20 \text{ μm}$$

A passive component according to a second invention comprises a dielectric substrate including a plurality of stacked dielectric layers, the dielectric substrate having an inductor-forming region, in which at least one inductor is arranged in a direction perpendicular to a direction in which the dielectric layers are stacked, and a capacitor-forming region, which includes at least one capacitor electrically connected to at least one of the at least one inductor. At least one inductor in the inductor-forming region is disposed in the dielectric substrate with a dielectric layer interposed therebetween, and at least two pairs of inductor-forming electrodes, which are electrically connected through via holes, are arranged along the direction in which the dielectric layers are stacked. Further, each of the pairs of inductor-forming electrodes is electrically connected to each other through via holes disposed therebetween.

In the passive component, the relation $0<Da\leqq Db$ is satisfied, where Da represents the shortest distance between each of the pairs of inductor-forming electrodes, and Db represents the shortest distance between pairs of inductor-forming electrodes that are adjacent to each other.

The distance Da preferably falls within the range:

$$0\ \mu m < Da \leqq 20\ \mu m$$

The passive component according to the second invention may further comprise an innerlayer ground electrode disposed in the dielectric substrate, and which is electrically connected to a ground terminal disposed on a surface of the dielectric substrate. The innerlayer ground electrode, the capacitor-forming region, and the inductor-forming region are arranged along the direction in which the dielectric layers are stacked.

As described above, the electronic component and the passive component according to the present invention are capable of further increasing the Q factor of an inductor, thereby achieving attenuation in adjacent frequency bands, and realizing a low power consumption level based on low loss, by clarifying a correlation between the distance between a pair of identical patterns, and the distance between pairs of identical patterns that are adjacent to each other along a direction in which they are stacked.

DETAILED DESCRIPTON OF THE INVENTION

Embodiments of an electronic component according to the present invention, which is applied to a passive component, will be described below with reference to FIGS. 1 through 18.

Figure 1:
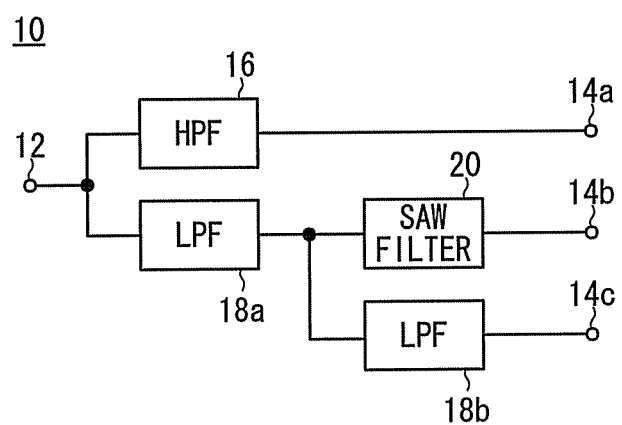
FIG. 1 is a block diagram showing a structural example of a passive component according to an embodiment of the present invention.

As shown in FIG. 1, a passive component 10 according to an embodiment of the present invention comprises a triplexer, having a single input terminal 12 and three output terminals (first through third output terminals 14a through 14c).

A high-pass filter 16 is connected between the input terminal 12 and the first output terminal 14a. A first low-pass filter 18a and a surface acoustic wave (SAW) filter 20 are connected in series between the input terminal 12 and the second output terminal 14b. The first low-pass filter 18a and a second low-pass filter 18b are connected in series between the input terminal 12 and the third output terminal 14c.

Figure 2:
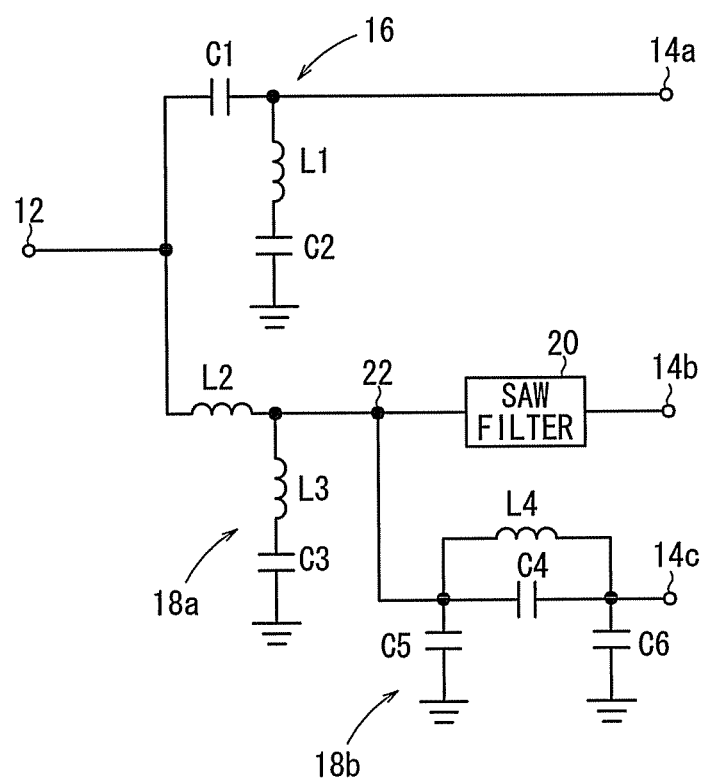
FIG. 2 is a circuit diagram showing the structural example of the passive component according to the embodiment of the present invention.

FIG. 2 shows a structural example of the circuit of the passive component 10. The high-pass filter 16 comprises a first capacitor C1 connected between the input terminal 12 and the first output terminal 14a, and a series-connected circuit made up of a first inductor L1 and a second capacitor C2 connected between the first output terminal 14a and GND (ground).

The first low-pass filter 18a comprises a second inductor L2 connected between the input terminal 12 and a junction 22 (a junction between the first low-pass filter 18a and the SAW filter 20), and a series-connected circuit made up of a third inductor L3 and a third capacitor C3, which are connected between a line between the second inductor L2 and the junction 22 and GND.

The second low-pass filter 18b comprises a parallel-connected circuit made up of a fourth inductor L4 and a fourth capacitor C4 connected between the junction 22 and the third output terminal 14c, a fifth capacitor C5 connected between the junction 22 and GND, and a sixth capacitor C6 connected between the third output terminal 14c and GND.

Figure 3:
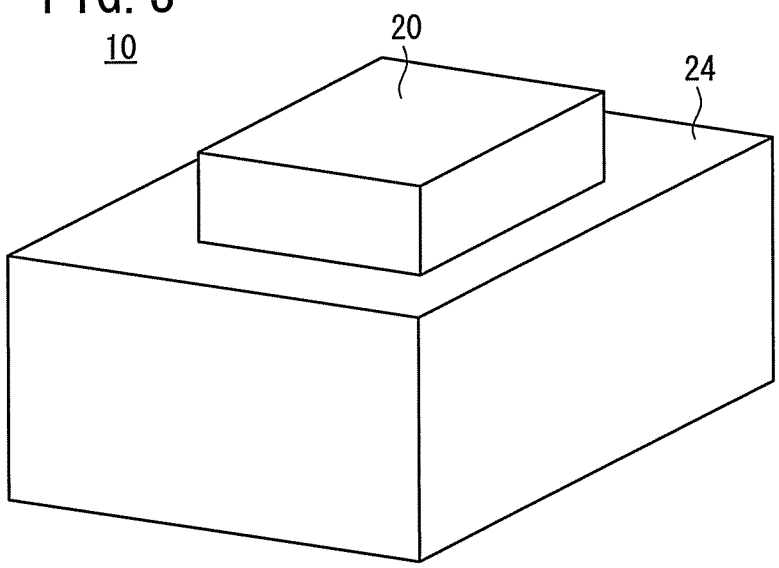
FIG. 3 is a perspective view showing the appearance of the passive component according to the embodiment of the present invention.

As shown in FIG. 3, the passive component 10 has an appearance such that the passive component 10 includes a dielectric substrate 24 comprising a plurality of stacked dielectric layers (to be described later) with a plurality of electrodes disposed therein, and a SAW filter 20 mounted on the dielectric substrate 24.

Figure 4:
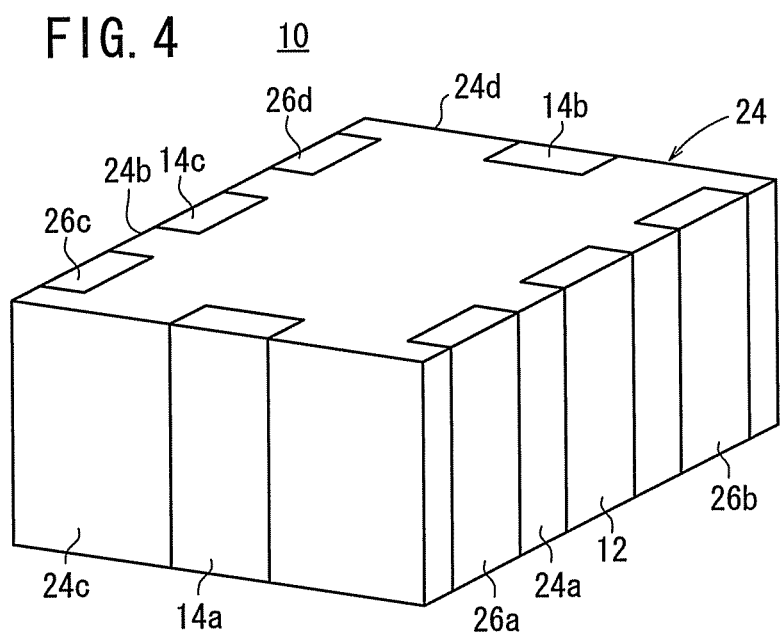
FIG. 4 is a perspective view, partially omitted from illustration, of an example of a terminal structure (side surface terminal structure) of the passive component according to the embodiment of the present invention.

As shown in FIG. 4, the passive component 10 may employ a side surface terminal structure including three terminals on a first side surface 24a of the dielectric substrate 24, i.e., a central terminal serving as the input terminal and two ground terminals (first ground terminal 26a, second ground terminal 26b) on both sides of the central terminal, three terminals on a second side surface 24b (a side surface opposite to the first side surface 24a) of the dielectric substrate 24, i.e., a central terminal serving as the third output terminal 14c and two ground terminals (third ground terminal 26c, fourth ground terminal 26d) on both sides of the central terminal, a terminal serving as the first output terminal 14a on a third side surface 24c of the dielectric substrate 24, and a terminal serving as the second output terminal 14b on a fourth side surface 24d (a side surface opposite to the third side surface 24c) of the dielectric substrate 24.

Figure 5:
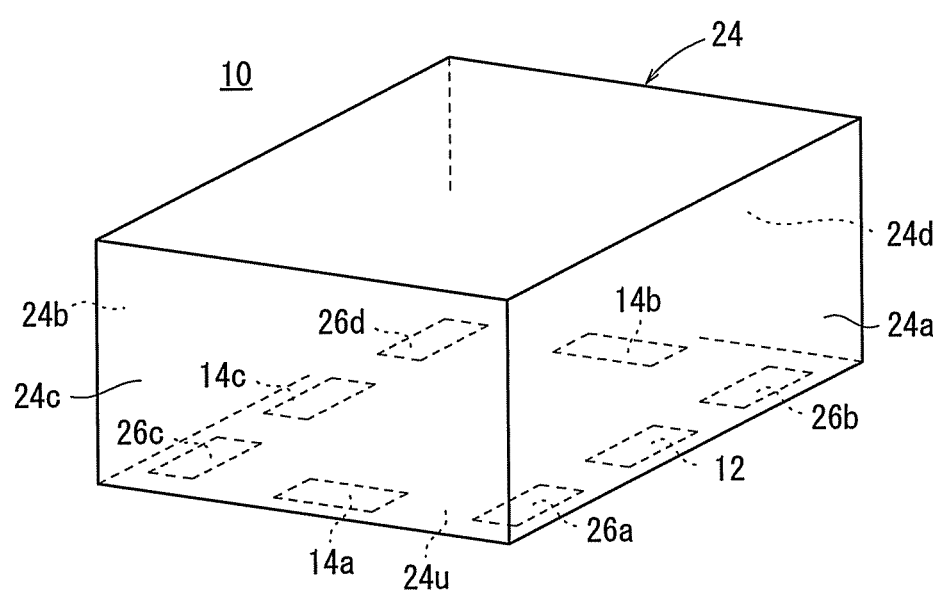
FIG. 5 is a perspective view, partially omitted from illustration, of another example of a terminal structure (lower surface terminal structure) of the passive component according to the embodiment of the present invention.

As shown in FIG. 5, the passive component 10 may alternatively employ a lower surface terminal structure, in which all of the terminals are disposed on a lower surface 24u of the dielectric substrate 24. The terminals include three terminals disposed on the lower surface of the dielectric substrate 24 near the first side surface 24a, i.e., a central terminal serving as the input terminal 12 and two ground terminals (first ground terminal 26a, second ground terminal 26b) on both sides of the central terminal, three terminals disposed on the lower surface 24u of the dielectric substrate 24 near the second side surface 24b, i.e., a central terminal serving as the third output terminal 14c and two ground terminals (third ground terminal 26c, fourth ground terminal 26d) on both sides of the central terminal, a terminal serving as the first output terminal 14a disposed on the lower surface 24u of the dielectric substrate 24 near the third side surface 24c, and a terminal serving as the second output terminal 14b disposed on the lower surface 24u of the dielectric substrate 24 near the fourth side surface 24d.

In FIGS. 4 and 5, an electrode structure (the number and layout, etc., of the electrodes) in an area where the SAW filter 20 is mounted has been omitted from illustration.

The dielectric substrate 24 has a plurality of electrodes disposed therein, which make up the high-pass filter 16, the first low-pass filter 18a, and the second low-pass filter 18b, except for the SAW filter 20.

Figure 6:
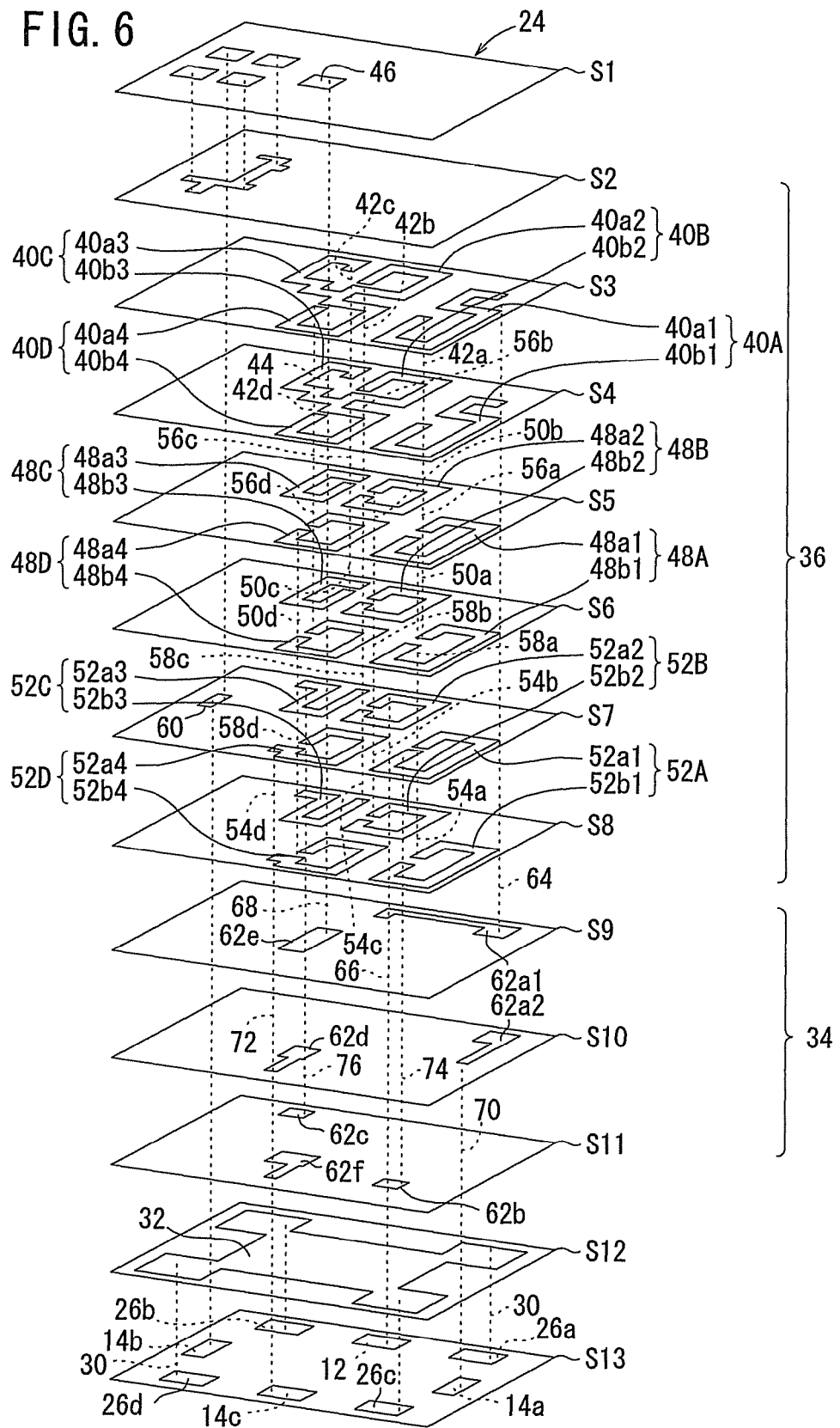
FIG. 6 is an exploded perspective view of a structural example of the passive component according to the embodiment of the present invention.
Figure 7:
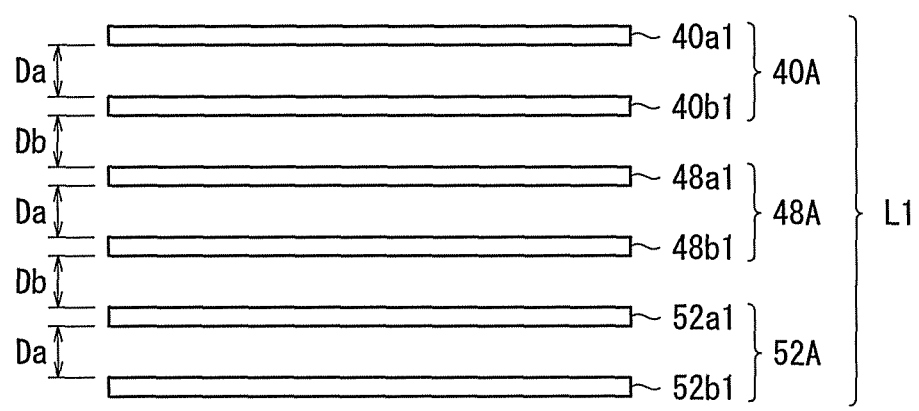
FIG. 7 is a view illustrative of a model (embodiment) of a portion of a passive component used in an experimental example.

The electrode structure of such electrodes will be described by way of example with reference to FIG. 6. In FIG. 6, a lower surface terminal structure (see FIG. 5) is employed.

As shown in FIG. 6, the dielectric substrate 24 comprises first through thirteenth dielectric layers S1 through S13 stacked together successively in order from above. The first through thirteenth dielectric layers S1 through S13 may comprise a single layer, or a plurality of layers each.

A plurality of electrodes for mounting the SAW filter 20 (not shown in FIG. 6) are disposed on a principal surface of the first dielectric layer S1, and on a principal surface of the second dielectric layer S2.

The twelfth dielectric layer S12 supports on a principal surface thereof an innerlayer ground electrode 32, which is electrically connected to the first through fourth ground terminals 26a through 26d through a via hole 30.

The passive component 10 includes the innerlayer ground electrode 32, a capacitor-forming region 34, and an inductor-forming region 36, which are arranged along a direction in which the dielectric layers are stacked (upwardly from below). The inductor-forming region 36 covers a range from the third dielectric layer S3 to the eighth dielectric layer S8, while the capacitor-forming region 34 covers a range from the ninth dielectric layer S9 to the eleventh dielectric layer S11. The dielectric layers in the inductor-forming region 36 should preferably be made of a material having a low dielectric constant, whereas the dielectric layers in the capacitor-forming region 34 should preferably be made of a material having a high dielectric constant. Therefore, the dielectric substrate has a structure made up of different materials which are joined to each other.

The third dielectric layer S3 in the inductor-forming region 36 supports on a principal surface thereof four inductor-forming electrodes (electrodes 40a1 through 40a4). The fourth dielectric layer S4 also supports on a principal surface thereof four inductor-forming electrodes (electrodes 40b1 through 40b4).

The electrodes 40a1, 40b1 have shapes with substantially identical patterns, and face each other with the third dielectric layer S3 being interposed therebetween. The electrodes 40a1, 40b1 are electrically connected to each other through a via hole 42a. The electrodes 40a2, 40b2 also have shapes with substantially identical patterns, face each other, and are electrically connected to each other through a via hole 42b. Similarly, the electrodes 40a3, 40b3 have shapes with substantially identical patterns, face each other, and are electrically connected to each other through a via hole 42c. The electrodes 40a4, 40b4 have shapes with substantially identical patterns, face each other, and are electrically connected to each other through a via hole 42d.

The electrodes 40a1, 40b1 make up a pair of inductor-forming electrodes 40A. The electrodes 40a2, 40b2 make up a pair of inductor-forming electrodes 40B. The electrodes 40a3, 40b3 make up a pair of inductor-forming electrodes 40C. Similarly, the electrodes 40a4, 40b4 make up a pair of inductor-forming electrodes 40D.

The electrodes 40a2, 40a3, 40a4 have respective ends connected to each other. Similarly, the electrodes 40b2, 40b3, 40b4 have respective ends connected to each other. The connected ends are electrically connected to a mounting electrode 46 for the SAW filter 20 on the first dielectric layer S1 through a via hole 44. In other words, the connected ends provide respective junctions for the pair of inductor-forming electrodes 40B, the pair of inductor-forming electrodes 40C, and the pair of inductor-forming electrodes 40D.

Likewise, the fifth dielectric layer S5 supports on a principal surface thereof four inductor-forming electrodes (electrodes 48a1 through 48a4), and the sixth dielectric layer S6 also supports on a principal surface thereof four inductor-forming electrodes (electrodes 48b1 through 48b4).

The electrodes 48a1, 48b1 have shapes with substantially identical patterns, face toward each other with the fifth dielectric layer S5 being interposed therebetween, and are electrically connected to each other through a via hole 50a. The electrodes 48a2, 48b2 also have shapes with substantially identical patterns, face each other, and are electrically connected to each other through a via hole 50b. Similarly, the electrodes 48a3, 48b3 have shapes with substantially identical patterns, face each other, and are electrically connected to each other through a via hole 50c. The electrodes 48a4, 48b4 have shapes with substantially identical patterns, face each other, and are electrically connected to each other through a via hole 50d.

The electrodes 48a1, 48b1 makeup a pair of inductor-forming electrodes 48A. The electrodes 48a2, 48b2 make up a pair of inductor-forming electrodes 48B. The electrodes 48a3, 48b3 make up a pair of inductor-forming electrodes 48C. The electrodes 48a4, 48b4 make up a pair of inductor-forming electrodes 48D.

Likewise, the seventh dielectric layer S7 supports on a principal surface thereof four inductor-forming electrodes (electrodes 52a1 through 52a4), and the eighth dielectric layer S8 supports on a principal surface thereof four inductor-forming electrodes (electrodes 52b1 through 52b4).

The electrodes 52a1, 52b1 have shapes with substantially identical patterns, face each other with the seventh dielectric layer S7 being interposed therebetween, and are electrically connected to each other through a via hole 54a. The electrodes 52a2, 52b2 have shapes with substantially identical patterns, face each other, and are electrically connected to each other through a via hole 54b. Similarly, the electrodes 52a3, 52b3 have shapes with substantially identical patterns, face each other, and are electrically connected to each other through a via hole 54c. The electrodes 52a4, 52b4 have shapes with substantially identical patterns, face each other, and are electrically connected to each other through a via hole 54d.

The electrodes 52a1, 52b1 make up a pair of inductor-forming electrodes 52A. The electrodes 52a2, 52b2 make up a pair of inductor-forming electrodes 52B. The electrodes 52a3, 52b3 make up a pair of inductor-forming electrodes 52C. The electrodes 52a4, 52b4 make up a pair of inductor-forming electrodes 52D.

The pair of inductor-forming electrodes 40A and the pair of inductor-forming electrodes 48A are electrically connected to each other through a via hole 56a disposed in the fourth dielectric layer S4. The pair of inductor-forming electrodes 40B and the pair of inductor-forming electrodes 48B are electrically connected to each other through a via hole 56b disposed in the fourth dielectric layer S4. The pair of inductor-forming electrodes 40C and the pair of inductor-forming electrodes 48C are electrically connected to each other through a via hole 56c disposed in the fourth dielectric layer S4. The pair of inductor-forming electrodes 40D and the pair of inductor-forming electrodes 48D are electrically connected to each other through a via hole 56d disposed in the fourth dielectric layer S4.

Similarly, the pair of inductor-forming electrodes 48A and the pair of inductor-forming electrodes 52A are electrically connected to each other through a via hole 58a disposed in the sixth dielectric layer S6. The pair of inductor-forming electrodes 48B and the pair of inductor-forming electrodes 52B are electrically connected to each other through a via hole 58b disposed in the sixth dielectric layer S6. The pair of inductor-forming electrodes 48C and the pair of inductor-forming electrodes 52C are electrically connected to each other through a via hole 58c disposed in the sixth dielectric layer S6. The pair of inductor-forming electrodes 48D and the pair of inductor-forming electrodes 52D are electrically connected to each other through a via hole 58d disposed in the sixth dielectric layer S6.

The pair of inductor-forming electrodes 40A, the via hole 56a, the pair of inductor-forming electrodes 48A, the via hole 58a, and the pair of inductor-forming electrodes 52A jointly make up the first inductor L1 shown in FIG. 2. The pair of inductor-forming electrodes 40B, the via hole 56b, the pair of inductor-forming electrodes 48B, the via hole 58b, and the pair of inductor-forming electrodes 52B jointly make up the second inductor L2 shown in FIG. 2. The pair of inductor-forming electrodes 40C, the via hole 56c, the pair of inductor-forming electrodes 48C, the via hole 58c, and the pair of inductor-forming electrodes 52C jointly make up the third inductor L1 shown in FIG. 2. The pair of inductor-forming electrodes 40D, the via hole 56d, the pair of inductor-forming electrodes 48D, the via hole 58d, and the pair of inductor-forming electrodes 52D jointly make up the fourth inductor L4 shown in FIG. 2.

The seventh dielectric layer S7 supports on a principal surface thereof a connection electrode 60, which serves to adjust the position where the second output terminal 14b and the SAW filter mounting electrodes are connected to each other.

The ninth dielectric layer S9 supports on a principal surface thereof two capacitor-forming electrodes (capacitor electrode 62a1, fifth capacitor electrode 62e). The capacitor electrode 62a1 is electrically connected to the pair of inductor-forming electrodes 40A through a via hole 64 disposed in the third through eighth dielectric layers S3 through S8, while also being electrically connected to the pair of inductor-forming electrodes 52B and the input terminal 12 through a via hole 66 disposed in the seventh through thirteenth dielectric layers S7 through S13. The fifth capacitor electrode 62e is electrically connected to the connected ends described above (i.e., junctions between the pair of inductor-forming electrodes 40B, the pair of inductor-forming electrodes 40C, and the pair of inductor-forming electrodes 40D) through a via hole 68 disposed in the third through eighth dielectric layers S3 through S8.

The tenth dielectric layer S10 supports on a principal surface thereof two capacitor-forming electrodes (capacitor electrode 62a2 fourth capacitor electrode 62d). The capacitor electrode 62a2 is positioned in facing relation to the capacitor electrode 62a1, with the ninth dielectric layer S9 being interposed therebetween, and is electrically connected to the first output terminal 14a through a via hole 70 disposed in the tenth through thirteenth dielectric layers S10 through S13. The fourth capacitor electrode 62d is positioned in facing relation to the fifth capacitor electrode 62e, with the ninth dielectric layer S9 being interposed therebetween, and is electrically connected to the pair of inductor-forming electrodes 52D and the third output terminal 14c through a via hole 72 disposed in the seventh through thirteenth dielectric layers S7 through S13.

The eleventh dielectric layer S11 supports on a principal surface thereof three capacitor-forming electrodes (second capacitor electrode 62b, third capacitor electrode 62c, sixth capacitor electrode 62f). The second capacitor electrode 62b faces toward the innerlayer ground electrode 32 positioned underneath, with the eleventh dielectric layer S11 being interposed between the second capacitor electrode 62b and the innerlayer ground electrode 32, and is electrically connected to the pair of inductor-forming electrodes 52A through a via hole 74, which is disposed in the seventh through tenth dielectric layers S7 through S10. The third capacitor electrode 62c faces toward the innerlayer ground electrode 32 positioned underneath, with the eleventh dielectric layer S11 being interposed between the third capacitor electrode 62c and the innerlayer ground electrode 32, and is electrically connected to the pair of inductor-forming electrodes 52C through a via hole 76, which is disposed in the seventh through tenth dielectric layers S7 through S10. The sixth capacitor electrode 62f faces toward the fourth capacitor electrode 62d positioned above, with the tenth dielectric layer S10 being interposed between the sixth capacitor electrode 62f and the fourth capacitor electrode 62d, faces toward the innerlayer ground electrode 32 positioned underneath, with the eleventh dielectric layer S11 being interposed between the sixth capacitor electrode 62f and interlaver ground electrode 32, and is electrically connected to the pair of inductor-forming electrodes 52D, the fourth capacitor electrode 62d, and the third output terminal 14c through the via hole 72, which is disposed in the seventh through thirteenth dielectric layers S7 through S13.

As shown in FIG. 2, the capacitor electrode 62a1 and the capacitor electrode 62a2 jointly make up the first capacitor C1. The second capacitor electrode 62b and the innerlayer ground electrode 32 jointly make up the second capacitor C2.

The third capacitor electrode 62c and the innerlayer ground electrode 32 jointly make up the third capacitor C3. The fourth capacitor electrode 62d and the sixth capacitor electrode 62f jointly make up the fourth capacitor C4. The fifth capacitor electrode 62e and the innerlayer ground electrode 32 jointly make up the fifth capacitor C5. The sixth capacitor electrode 62f and the innerlayer ground electrode 32 jointly make up the sixth capacitor C6.

An experimental example will be illustrated below. The experimental example measured changes in the Q factor depending on a distance between a pair of identical patterns, and a distance between pairs of identical patterns that are adjacent to each other along the direction in which they are stacked. More specifically, as shown schematically in FIG. 7, Q factors and inductance values (nH) with respect to a frequency of 1 GHz were measured for each of the pair of inductor-forming electrodes 40A, the pair of inductor-forming electrodes 48A, and the pair of inductor-forming electrodes 52A, which make up the first inductor L1 of the passive component 10, as shown schematically in FIG. 7. The measured results are shown in Table 1.

TABLE 1

| Da (µm) | Db (µm) | Q factor | L value (nH) | Q * L |
|---|---|---|---|---|
| 0 | 12 | 37.9 | 13.3 | 502 |
| 0 | 27 | 47.4 | 10.5 | 498 |
| 0 | 61 | 58.2 | 8.8 | 509 |
| 12 | 12 | 45.3 | 11.0 | 498 |
| 12 | 27 | 61.9 | 9.0 | 558 |
| 12 | 61 | 70.1 | 7.8 | 549 |
| 27 | 12 | 49.5 | 9.9 | 487 |
| 27 | 27 | 55.6 | 8.4 | 465 |
| 27 | 61 | 65.3 | 7.3 | 477 |
| 61 | 12 | 49.8 | 8.3 | 411 |
| 61 | 27 | 59.8 | 7.2 | 433 |
| 61 | 61 | 62.9 | 6.5 | 407 |

In Table 1, the distance Da represents the distance between the electrodes 40a1 and 40b1, which make up the pair of inductor-forming electrodes 40A, and the distance between the electrodes 48a1 and 48b1, which make up the pair of inductor-forming electrodes 48A, as well as the distance between the electrodes 52a1 and 52b1, which make up the pair of inductor-forming electrodes 52A. The distance Db represents the distance between the electrode 40b1 of the pair of inductor-forming electrodes 40A and the electrode 48a1 of the pair of inductor-forming electrodes 48A, as well as the distance between the electrode 48b1 of the pair of inductor-forming electrodes 48A and the electrode 52a1 of the pair of inductor-forming electrodes 52A.

Figure 8:
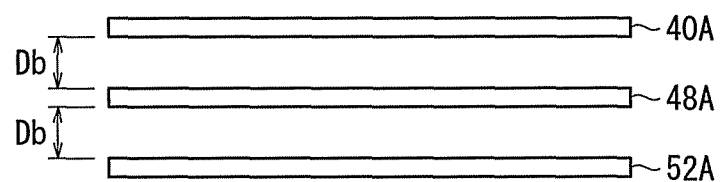
FIG. 8 is a view illustrative of a model (conventional structure) of a portion of a passive component used in the experimental example.

As shown in FIG. 8, the distance Da=0 represents a structure in which each of the inductor-forming electrode 40A, the inductor-forming electrode 48A, and the inductor-forming electrode 52A is not of a paired structure, but rather which corresponds to the conventional structure.

Figure 9:
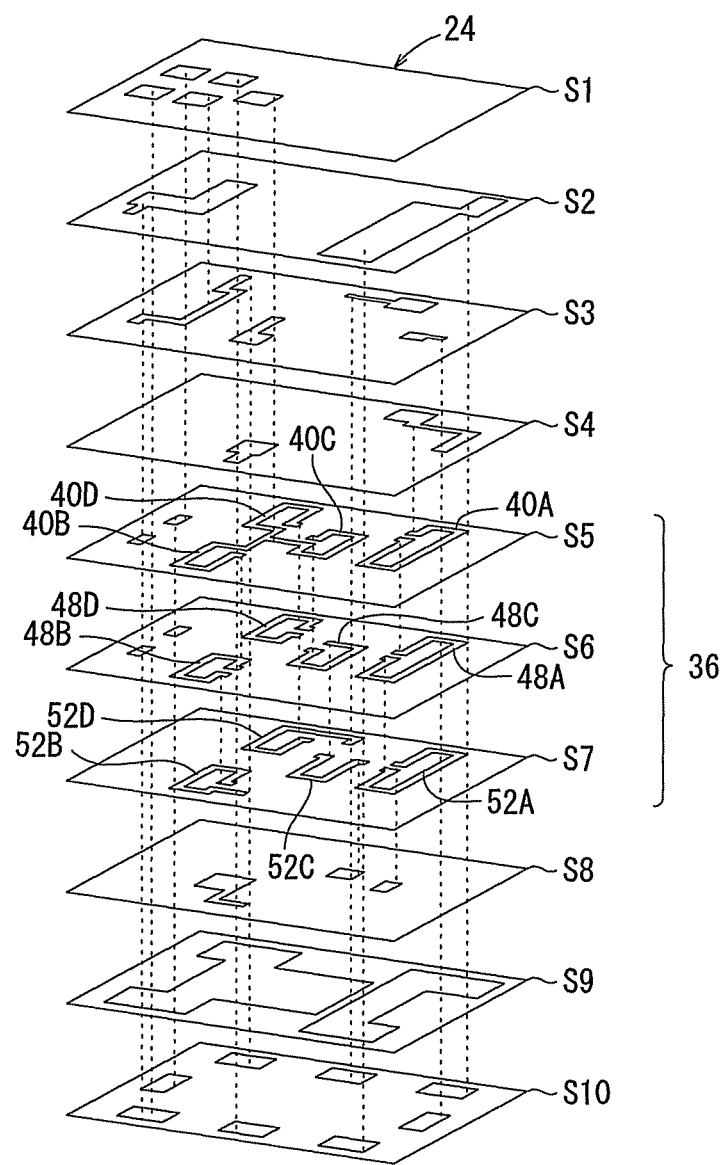
FIG. 9 is an exploded perspective view of a passive component having a conventional structure.

As shown in FIG. 9, a passive component based on the conventional structure has a dielectric substrate 24 comprising first through tenth dielectric layers S1 through S10, which are stacked together successively in this order from above. An inductor-forming region 36 covers a range from the fifth dielectric layer S5 to the seventh dielectric layer S7. For the sake of brevity, descriptions of the capacitor-forming region and the via holes shall be omitted.

In the conventional structure, the fifth dielectric layer S5 supports on a principal surface thereof one each of the inductor-forming electrodes 40A through 40D, the sixth dielectric layer S6 supports on a principal surface thereof one each of the inductor-forming electrodes 48A through 48D, and the seventh dielectric layer S7 supports on a principal surface thereof one each of the inductor-forming electrodes 52A through 52D.

The inductor-forming electrode 40A, the inductor-forming electrode 48A, and the inductor-forming electrode 52A are electrically connected to each other through a via hole, thereby jointly making up the first inductor L1 shown in FIG. 2. The inductor-forming electrode 40B, the inductor-forming electrode 48B, and the inductor-forming electrode 52B are electrically connected to each other through a via hole, thereby jointly making up the second inductor L2 shown in FIG. 2. The inductor-forming electrode 40C, the inductor-forming electrode 48C, and the inductor-forming electrode 52C are electrically connected to each other through a via hole, thereby jointly making up the third inductor L3 shown in FIG. 2. The inductor-forming electrode 40D, the inductor-forming electrode 48D, and the inductor-forming electrode 52D are electrically connected to each other through a via hole, thereby jointly making up the fourth inductor L4 shown in FIG. 2.

Figure 10:
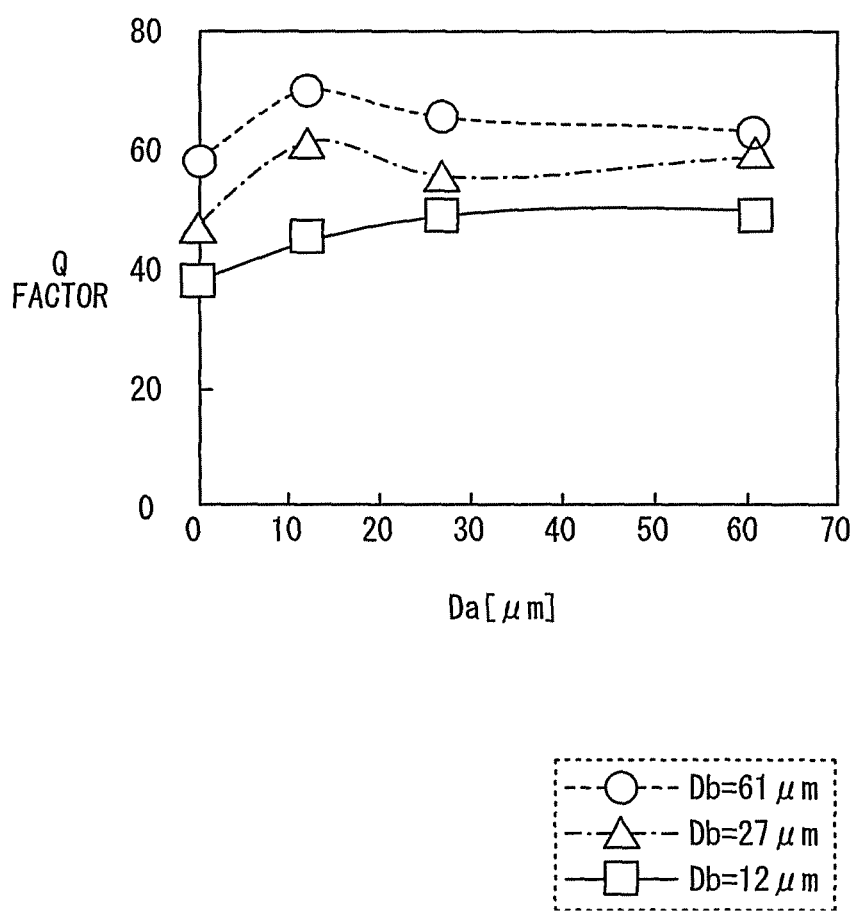
FIG. 10 is a characteristic diagram showing changes in the Q factor at a time when a distance Da is increased.
Figure 11:
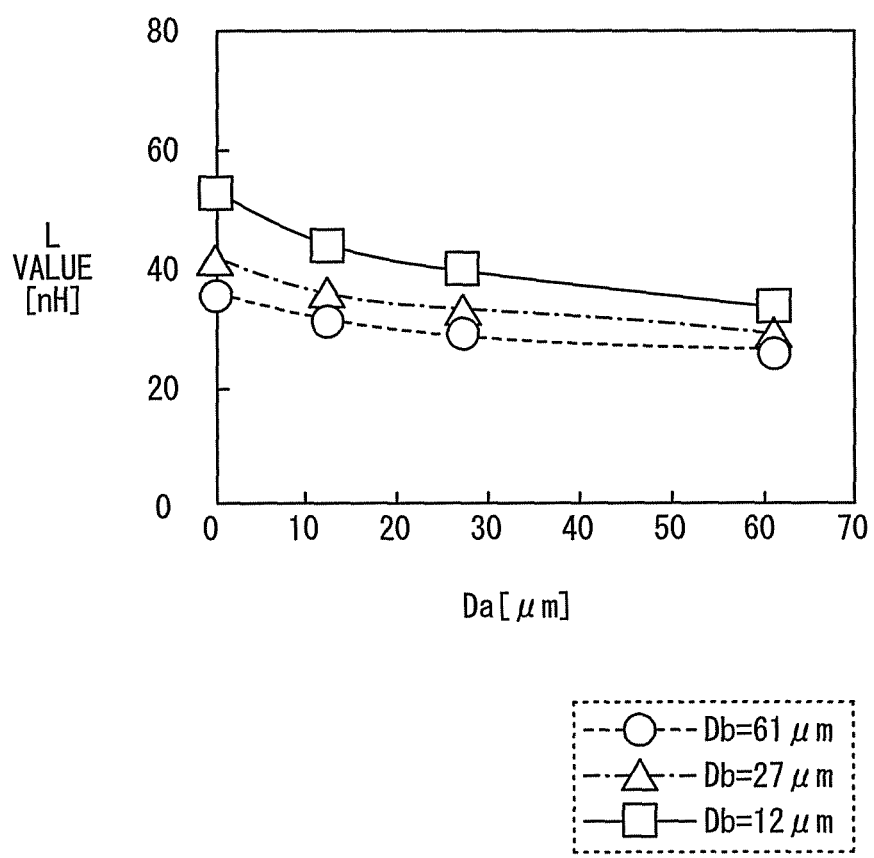
FIG. 11 is a characteristic diagram showing changes in the L value at a time when the distance Da is increased.
Figure 12:
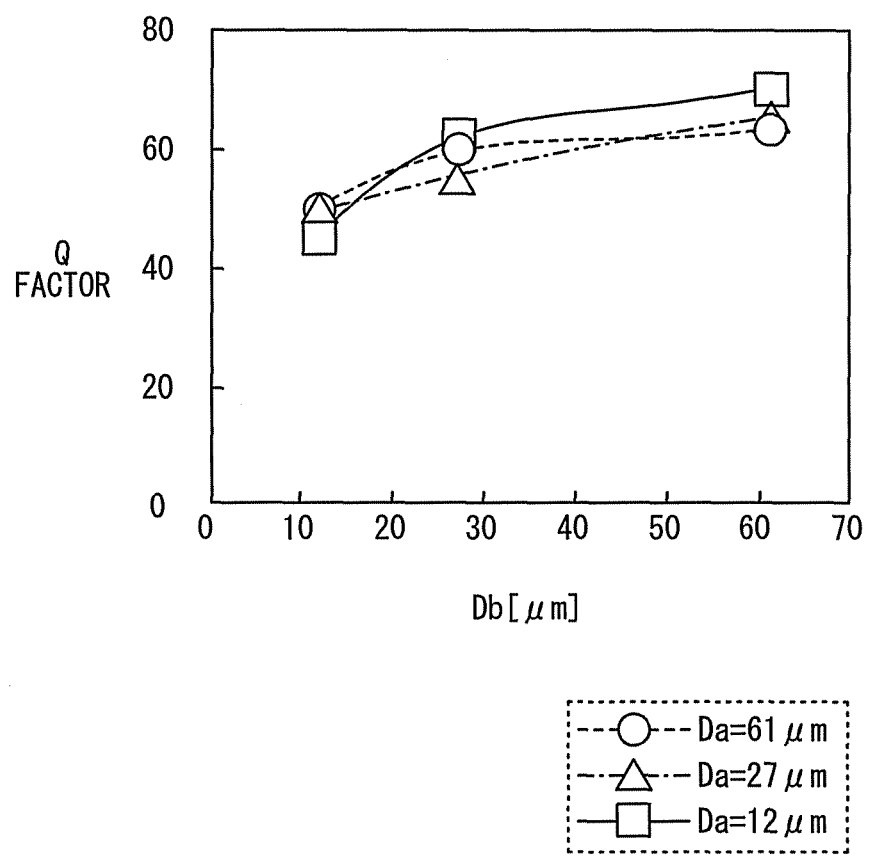
FIG. 12 is a characteristic diagram showing changes in the Q factor at a time when a distance Db is increased.
Figure 13:
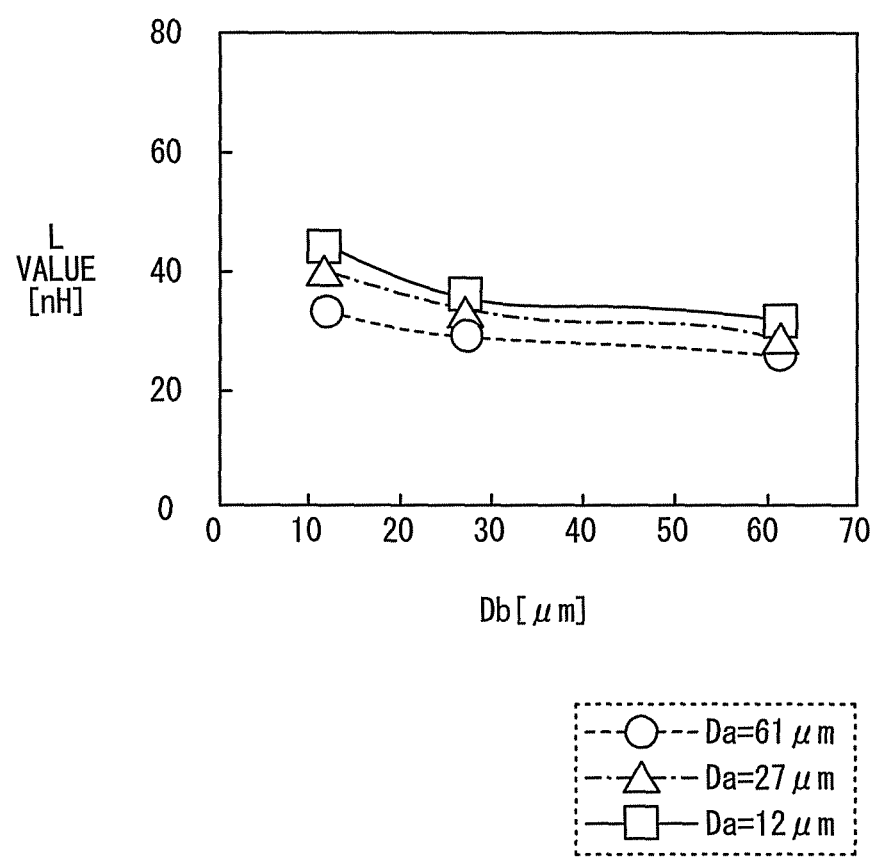
FIG. 13 is a characteristic diagram showing changes in the L value at a time when the distance Db is increased.

As a result of an experimental example, changes in the Q factor at a time when the distance Da was increased are shown in FIG. 10. Changes in the inductance value at a time when the distance Da was increased are shown in FIG. 11. Changes in the Q factor at a time when the distance Db was increased are shown in FIG. 12. Changes in the inductance value at a time when the distance Db was increased are shown in FIG. 13. It can be seen from FIGS. 10 and 12 that the Q factor has a tendency to increase as the distances Da, Db increase. Also, it can be seen from FIGS. 11 and 13 that the inductance value has a tendency to decrease as the distances Da, Db increase.

Figure 14:
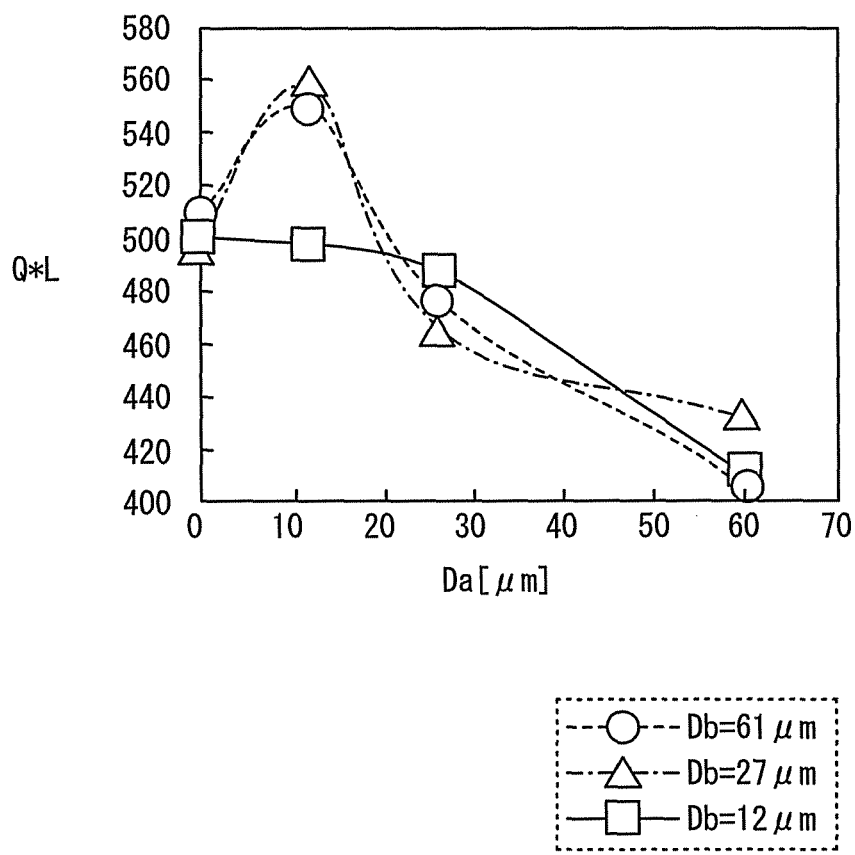
FIG. 14 is a characteristic diagram showing changes in the Q value×L value at a time when the distance Da is increased.

In order to review both the Q factor and the inductance value, changes in the Q factor×the inductance value (represented by Q*L in the drawings) were observed. FIG. 14 shows changes in the Q factor×the inductance value at a time when the distance Da is increased, whereas FIG. 15 shows changes in the Q factor×the inductance value at a time when the distance Db is increased.

Figure 15:
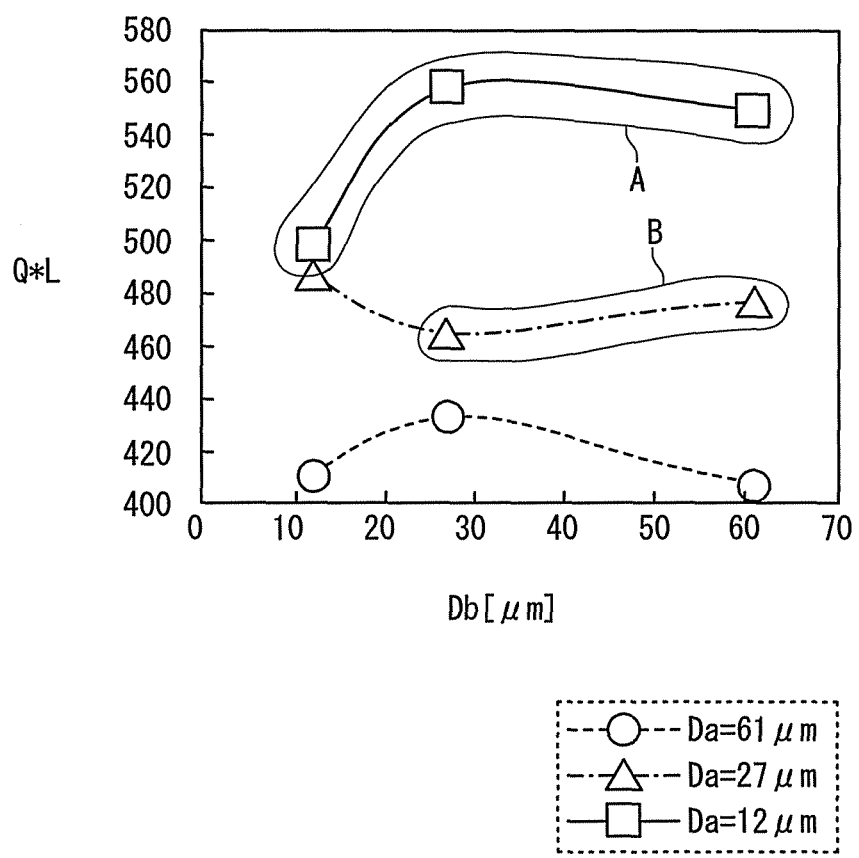
FIG. 15 is a characteristic diagram showing changes in the Q value×L value at a time when the distance Db is increased.

As indicated by frames A, B in FIG. 15, the Q factor×the inductance value has a tendency to increase within the range of $0 < Da \leq Db$.

As shown in FIG. 14, in the range of $0\,\mu m < Da \leq 20\,\mu m$, the Q factor×the inductance value has a value which is higher than the conventional value (=500).

As shown in FIG. 6, the passive component 10 includes the innerlayer ground electrode 32, the capacitor-forming region 34, and the inductor-forming region 36, which are arranged along a direction in which the dielectric layers are stacked (upwardly from below).

Figure 16:
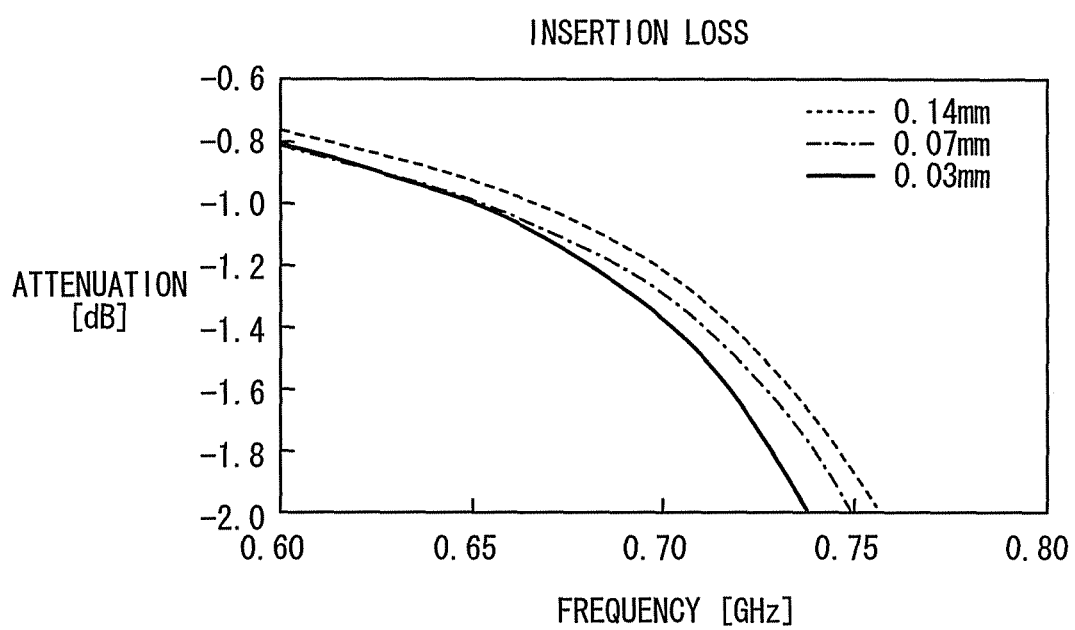
FIG. 16 is a characteristic diagram showing a relationship between insertion loss and an interlayer distance between a capacitor-forming region and an inductor-forming region.
Figure 17:
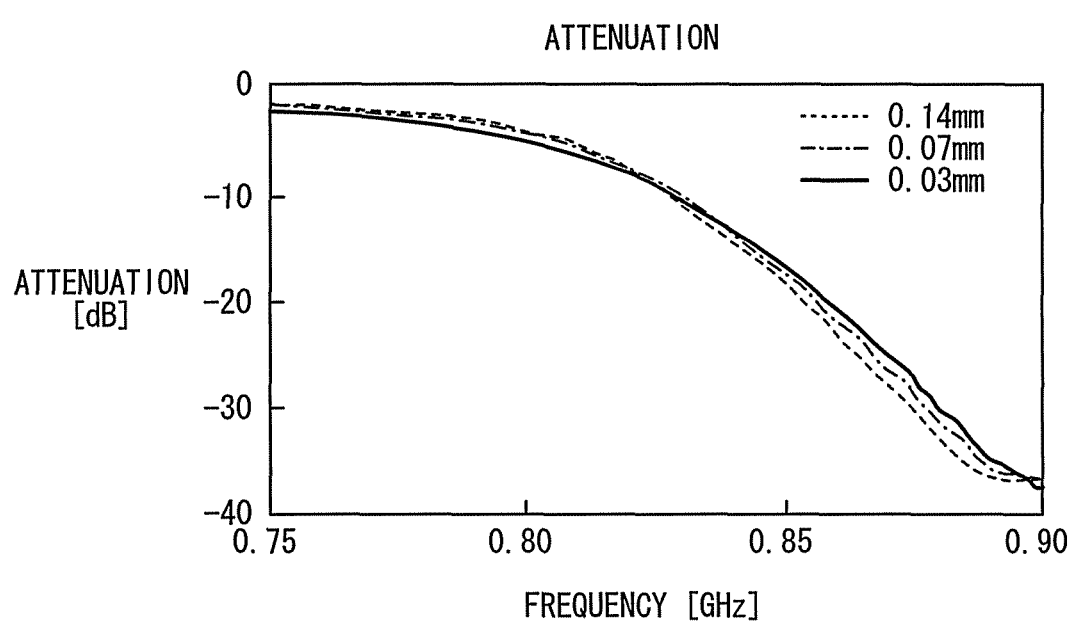
FIG. 17 is a characteristic diagram showing a relationship between attenuation and an interlayer distance between a capacitor-forming region and an inductor-forming region.

If the distance Da=0, then as the interlayer distance between the capacitor-forming region 34 and the inductor-forming region 36 becomes reduced, the Q factor deteriorates, insertion loss increases, and attenuation becomes less sharp, as shown in FIGS. 16 and 17. While these problems can be solved by increasing the interlayer distance between the capacitor-forming region 34 and the inductor-forming region 36, such a solution may possibly pose limitations on efforts to make the passive component lower in profile.

With the passive component 10 according to the present embodiment, since the inductor-forming electrodes are of a paired structure, the inductor-forming region 36 is increased in height (thickness), but since the Q factor can be increased, the interlayer distance between the capacitor-forming region 34 and the inductor-forming region 36 can be reduced, thus making it possible for the height of the passive component 10 to be at the same level as a conventional structure. Consequently, the disadvantage (i.e., failing to make the passive component lower in profile), which results from the paired structure of the inductor-forming electrodes, can be eliminated.

The passive component 10 according to the present embodiment is capable of further increasing the Q factor of the inductor, while achieving attenuation in adjacent frequency bands and realizing a low power consumption level based on low loss.

Although the above embodiment shows a passive component 10 having a plurality of filters in one dielectric substrate 24, alternatively, a plurality of inductors and a plurality of capacitors may jointly make up one filter. An example of such an alternative is shown in FIG. 18.

Figure 18:
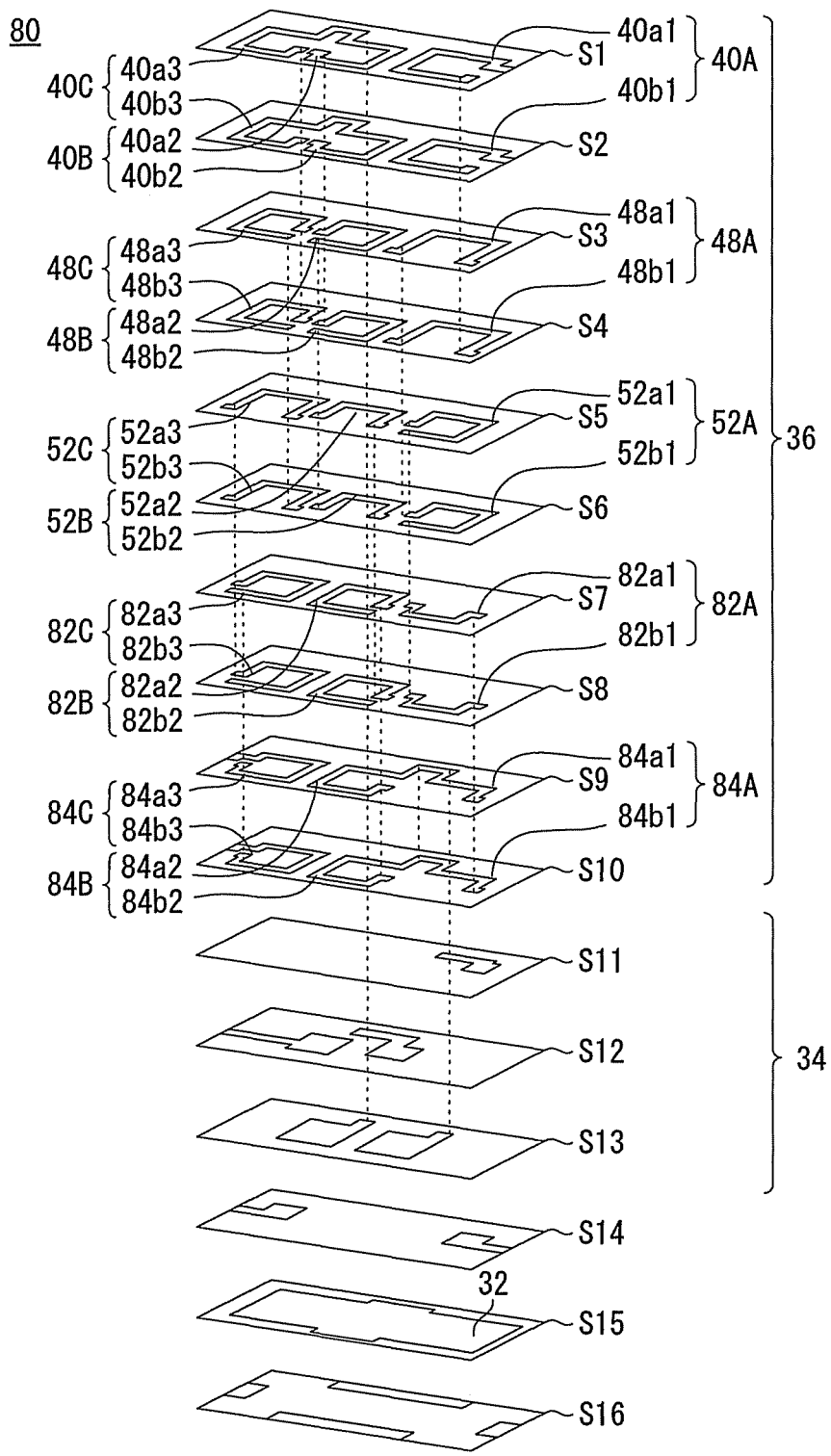
FIG. 18 is an exploded perspective view of a low-pass filter according to an embodiment of the present invention.

The filter shown in FIG. 18 comprises a low-pass filter 80, having a dielectric substrate 24 comprising a plurality of stacked dielectric layers (first through sixteenth dielectric layers S1 through S16). An inductor-forming region 36 covers a range from the first through tenth dielectric layers S1 through S10, and a capacitor-forming region 34 covers a range from the eleventh through fourteenth dielectric layers S11 through S14. For the sake of brevity, descriptions of the via holes and the capacitor-forming region 34 shall be omitted.

In the low-pass filter 80, as with the passive component 10 described above, the electrodes 40$a$1, 40$b$1 jointly make up the pair of inductor-forming electrodes 40A, the electrodes 40$a$2, 40$b$2 jointly make up the pair of inductor-forming electrodes 40B, and the electrodes 40$a$3, 40$b$3 jointly make up the pair of inductor-forming electrodes 40C.

The electrodes 48$a$1, 48$b$1 jointly make up the pair of inductor-forming electrodes 48A, the electrodes 48$a$2, 48$b$2 jointly make up the pair of inductor-forming electrodes 48B, and the electrodes 48$a$3, 48$b$3 jointly make up the pair of inductor-forming electrodes 48C.

The electrodes 52$a$1, 52$b$1 jointly make up the pair of inductor-forming electrodes 52A, the electrodes 52$a$2, 52$b$2 jointly make up the pair of inductor-forming electrodes 52B, and the electrodes 52$a$3, 52$b$3 jointly make up the pair of inductor-forming electrodes 52C.

Similarly, electrodes 82$a$1, 82$b$1 jointly make up a pair of inductor-forming electrodes 82A, the electrodes 82$a$2, 82$b$2 jointly make up a pair of inductor-forming electrodes 82B, and the electrodes 82$a$3, 82$b$3 jointly make up a pair of inductor-forming electrodes 82C.

The electrodes 84$a$1, 84$b$1 jointly make up a pair of inductor-forming electrodes 84A, the electrodes 84$a$2, 84$b$2 jointly make up a pair of inductor-forming electrodes 84B, and the electrodes 84$a$3, 84$b$3 jointly make up a pair of inductor-forming electrodes 84C.

In the low-pass filter 80, similar to the passive component 10 described above, the distance Da between the two electrodes that make up a pair of inductor-forming electrodes, and the distance Db between a pair of inductor-forming electrodes are related to each other within the ranges of $0 < Da \leq Db$ and $0\ \mu m < Da \leq 20\ \mu m$.

Consequently, the low-pass filter 80 is capable of further increasing the Q factor of the inductor, thereby achieving attenuation in adjacent frequency bands, and realizing a low power consumption level based on low loss.

The electronic component and the passive component according to the present invention are not limited to the above embodiments, but may incorporate various arrangements therein without departing from the scope of the invention.

The invention claimed is:

1. A passive component comprising a dielectric substrate including a plurality of stacked dielectric layers;
   the dielectric substrate having an inductor-forming region, in which at least one inductor is arranged in a direction perpendicular to a direction in which the dielectric layers are stacked, and a capacitor-forming region, which includes at least one capacitor electrically connected to at least one of the at least one inductor;
   wherein the at least one inductor in the inductor-forming region is disposed in the dielectric substrate, and the inductor is formed of at least two pairs of inductor-forming electrodes, which are electrically connected through via holes and are arranged along the direction in which the dielectric layers are stacked, the inductor-forming electrodes of each pair facing each other with a dielectric layer interposed therebetween, and wherein the two pairs of inductor-forming electrodes are electrically connected to each other through a via hole disposed therebetween,
   wherein a relation $0 < Da < Db$ is satisfied, where Da represents a shortest distance between each of the pairs of inductor-forming electrodes, and Db represents a shortest distance between pairs of inductor-forming electrodes that are adjacent to each other,
   wherein Da is within a range of $0\ \mu m\ Da \leq 20\ \mu m$,
   wherein the passive component further comprises:
   an innerlayer ground electrode disposed in the dielectric substrate and which is electrically connected to a ground terminal disposed on a surface of the dielectric substrate, and
   wherein the innerlayer ground electrode, the capacitor-forming region and the inductor-forming region are arranged along a direction in which the dielectric layers are stacked.

* * * * *

UNITED STATES PATENT AND TRADEMARK OFFICE
CERTIFICATE OF CORRECTION

| | | |
|---|---|---|
| PATENT NO. | : 8,456,256 B2 | Page 1 of 1 |
| APPLICATION NO. | : 12/681796 | |
| DATED | : June 4, 2013 | |
| INVENTOR(S) | : Kouhei Takase | |

It is certified that error appears in the above-identified patent and that said Letters Patent is hereby corrected as shown below:

In the Specification

Column 8, line 59: Please change "interlaver" to -- innerlayer --

Column 12, line 35: Please change "$0 < Da < Db$" to -- $0 < Da \leq Db$ --

In the Claims

Column 12, line 40: Please change "$0 \ \mu m \ Da \leq 20 \ \mu m,$" to -- $0 \ \mu m < Da \leq 20 \ \mu m,$ --

Signed and Sealed this
Eighth Day of October, 2013

Teresa Stanek Rea
*Deputy Director of the United States Patent and Trademark Office*